United States Patent
Lin et al.

(10) Patent No.: US 12,132,128 B2
(45) Date of Patent: Oct. 29, 2024

(54) BACK-CONTACT CELL WITH ISOLATION GROOVES SPECIFICALLY DISPOSED AND PREPARATION METHOD THEREOF

(71) Applicant: GOLD STONE (FUJIAN) ENERGY COMPANY LIMITED, Fujian (CN)

(72) Inventors: Kairui Lin, Fujian (CN); Chaohua Zhang, Fujian (CN)

(73) Assignee: GOLD STONE (FUJIAN) ENERGY COMPANY LIMITED, Fujian (CN)

( * ) Notice: Subject to any disclaimer, the term of this patent is extended or adjusted under 35 U.S.C. 154(b) by 0 days.

(21) Appl. No.: 18/517,160

(22) Filed: Nov. 22, 2023

(65) Prior Publication Data

US 2024/0332439 A1 Oct. 3, 2024

(30) Foreign Application Priority Data

Mar. 31, 2023 (CN) .......................... 202310332245.3

(51) Int. Cl.
*H01L 31/0236* (2006.01)
*H01L 31/02* (2006.01)
(Continued)

(52) U.S. Cl.
CPC .... *H01L 31/02366* (2013.01); *H01L 31/0201* (2013.01); *H01L 31/022441* (2013.01);
(Continued)

(58) Field of Classification Search
None
See application file for complete search history.

(56) References Cited

U.S. PATENT DOCUMENTS 8,679,889 B2 * 3/2014 Cousins .......... H01L 31/022441
257/E31.13
2016/0020342 A1 * 1/2016 Heng .............. H01L 31/022466
136/256

FOREIGN PATENT DOCUMENTS

CN 111477694 A 7/2020
CN 115312633 A 11/2022
(Continued)

OTHER PUBLICATIONS

China National Intellectual Property Administration, Notification on the Grant for Patent Right for Invention (with English Translation), Chinese Patent Application No. 202310332245.3, 2 pages, May 24, 2023.

(Continued)

*Primary Examiner* — Tamir Ayad
(74) *Attorney, Agent, or Firm* — Thompson Hine LLP

(57) ABSTRACT

A back-contact cell with isolation grooves specifically disposed and a preparation method thereof. The back-contact cell includes: a silicon substrate having, on a back side, a polished region and a textured region disposed alternately along an X-axis direction of the back side, a first semiconductor layer disposed on the polished region, and a second semiconductor layer disposed on the textured region. The back-contact cell further includes a conductive film layer and a conductive mask layer sequentially disposed outwardly along a Z-axis direction of the back side. A conductive composite layer formed by the conductive mask layer and the conductive film layer is provided with isolation grooves disposed at intervals along the X-axis direction. The isolation groove is located above a contact interface between the first semiconductor layer and the second semiconductor layer in the Z-axis direction, and the isolation groove spans (Continued)

part of the polished region and part of the textured region in the X-axis direction.

12 Claims, 4 Drawing Sheets

(51) Int. Cl.
    *H01L 31/0224*     (2006.01)
    *H01L 31/077*     (2012.01)
    *H01L 31/18*     (2006.01)

(52) U.S. Cl.
    CPC .... *H01L 31/022475* (2013.01); *H01L 31/077* (2013.01); *H01L 31/188* (2013.01); *H01L 31/1888* (2013.01)

(56) References Cited

FOREIGN PATENT DOCUMENTS

| CN | 115513308 A | 12/2022 |
| --- | --- | --- |
| CN | 115621333 A | 1/2023 |
| CN | 116093176 A | 5/2023 |
| EP | 3223318 A1 | 9/2017 |
| JP | 2018164057 A | 10/2018 |

OTHER PUBLICATIONS

China State Intellectual Property Office, Notice of Grant of Invention Patent Right (with English translation), Chinese Patent Application No. 202310332245.3, 6 pages, May 24, 2023.

China State Intellectual Property Office, Notice of First Examination Opinion (with English translation), Chinese Patent Application No. 202310332245.3, 12 pages, May 10, 2023.

China State Intellectual Property Office (ISA/CN), International Search Report (with English translation), International Application No. PCT/US2023/119645, 6 pages, Nov. 2, 2023.

China State Intellectual Property Office (ISA/CN), Written Opinion of the International Searching Authority (with English translation), International Application No. PCT/US2023/119645, 8 pages, Nov. 2, 2023.

China State Intellectual Property Office (ISA/CN), International Search Report (with English translation), International Application No. PCT/CN2023/119645, 6 pages, Nov. 2, 2023.

China State Intellectual Property Office (ISA/CN), Written Opinion of the International Searching Authority (with English translation), International Application No. PCT/CN2023/119645, 8 pages, Nov. 2, 2023.

* cited by examiner

S105

BACK-CONTACT CELL WITH ISOLATION GROOVES SPECIFICALLY DISPOSED AND PREPARATION METHOD THEREOF

CROSS REFERENCE TO RELATED APPLICATIONS

The present disclosure claims priority to Chinese Patent Application No. 202310332245.3, filed with the Chinese Patent Office on Mar. 31, 2023, entitled "Back-contact Cell with Isolation Grooves Specifically Disposed and preparation Method thereof," the entirety of which is incorporated herein by reference.

TECHNICAL FIELD

The present disclosure pertains to the technical field of back-contact cells, and particularly to a back-contact cell with isolation grooves specifically disposed and a preparation method thereof.

BACKGROUND

Currently, among back-contact cells, for a cell structure in which only a layer of intrinsic amorphous silicon with a thickness of about 10 nm (which is a passivation layer for a second semiconductor layer) for insulation is disposed between a first doped silicon crystal layer in a first semiconductor layer and a second doped silicon crystal layer in the second semiconductor layer, the parallel resistance is small and the insulation effect is poor. When a conductive film layer is deposited on the second semiconductor layer, carriers in the second semiconductor layer are collected by the conductive film layer on the upper surface of the second doped silicon crystal layer and transmitted to a boundary region (i.e., a contact interface in the Z-axis direction) between the first semiconductor layer and the second semiconductor layer, and thus may create an electric leakage and micro-short-circuiting phenomenon in the boundary region between the first semiconductor layer and the second semiconductor layer together with carriers collected in the first semiconductor. However, the better conductivity the two semiconductor layers have, the more serious the electric leakage phenomenon is, which in turn affects the conversion efficiency of the cell.

SUMMARY

The present disclosure overcomes the defects of the back-contact cell structures existing in the prior art that it is impossible to achieve a balance between effective avoidance of the electric leakage and micro-short-circuiting phenomenon and the enhancement of the conversion efficiency of the cells, and that the grid electrodes have a large use amount of silver paste and a high cost. The present disclosure provides a back-contact cell with isolation grooves specifically disposed and a preparation method thereof, by which the electric leakage and micro-short-circuiting phenomenon is greatly ameliorated, while the conversion efficiency of the cell and the cell yield are improved, and the use amount of silver paste is greatly reduced, thereby greatly reducing the cost of metal electrodes.

An embodiment of the present disclosure provides a back-contact cell with isolation grooves specifically disposed, including: a silicon substrate having, on a back side, a polished region and a textured region disposed alternately along an X-axis direction of the back side; a first semiconductor layer disposed on the polished region; and a second semiconductor layer disposed on the textured region, wherein the back-contact cell further includes a conductive film layer and a conductive mask layer sequentially disposed outwardly along a Z-axis direction of the back side, a conductive composite layer formed by the conductive mask layer and the conductive film layer is provided with isolation grooves disposed at intervals along the X-axis direction, each isolation groove is located above a contact interface between the first semiconductor layer and the second semiconductor layer in the Z-axis direction, and the isolation groove spans part of the polished region and part of the textured region in the X-axis direction, wherein a ratio of a span length Wa1 of the isolation groove over the polished region to a span length Wa2 of the isolation groove over the textured region is 1:(0.1 to 4), optionally 1:(0.1 to 1).

An embodiment of the present disclosure further provides a preparation method for the back-contact cell, including the following steps:

S100, providing a cell panel including the silicon substrate having, on the back side, the first semiconductor layer and the second semiconductor layer, wherein a part of the back side where the first semiconductor layer is located is the polished region, and a part of the back side where the second semiconductor layer is located is the textured region;

S101, forming the conductive film layer fully covering the back side of the cell panel obtained in S100;

S102, forming the conductive mask layer on the back side of the cell panel obtained in S101, with isolation openings disposed at intervals along the X-axis direction being left in the conductive mask layer, wherein the isolation opening is located above a contact interface between the first semiconductor layer and the second semiconductor layer in the Z-axis direction, and spans the polished region and the textured region in the X-axis direction; and S103, etching the back side of the cell panel obtained in S102 to remove part of the conductive film layer located below the isolation openings, so as to form the isolation grooves located in the conductive composite layer formed by the conductive mask layer and the conductive film layer.

BRIEF DESCRIPTION OF DRAWINGS

In order to more clearly illustrate the technical solutions of examples of the present disclosure, drawings required to be used in the examples will be described briefly below. It is understood that the drawings below are merely illustrative of some examples of the present disclosure and thus should not be considered as limiting its scope. It will be appreciated by those ordinary skilled in the art that other relevant drawings can be obtained according to these drawings without any inventive effort.

DETAILED DESCRIPTION

Figure 1:
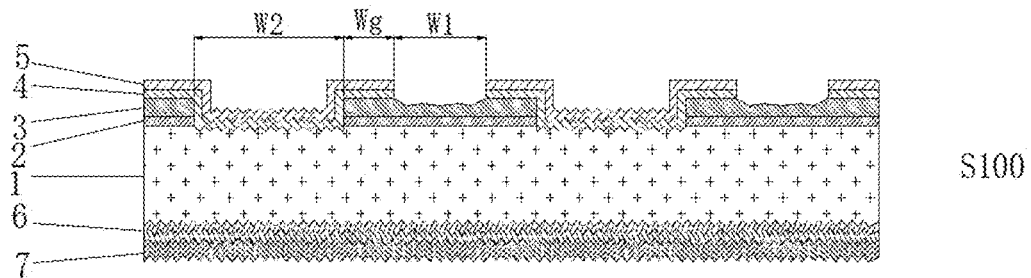
FIG. 1 is a schematic structural diagram of a back-contact cell panel having a front-side passivation layer and an antireflective layer formed on its front side and having a first semiconductor layer and a second semiconductor layer formed on its back side according to the present disclosure.

In the present disclosure, in the absence of a contrary description, orientation words such as "up, down, left, and right" used are generally understood with reference to orientations shown in the drawings and practical applications.

Embodiments of the present disclosure are described in detail below, and examples of the embodiments are illustrated in the drawings, throughout which identical or similar reference numerals denote identical or similar elements or elements having identical or similar functions. The examples described below by reference to the drawings are exemplary and are intended only to explain the present disclosure and should not be understood as a limitation of the present disclosure.

In the description of the present disclosure, it should be understand that the terms "center," "longitudinal," "transversal," "length," "width," "thickness," "up," "down," "front," "rear," "left," "right," "vertical," "horizontal," "top," "bottom," "inner," "outer," "clockwise," "counterclockwise," "axial," "radial," "circumferential," and the like indicate orientation or positional relationships based on the orientation or positional relationships shown in the drawings, and these terms are used only for facilitating the description of the present disclosure and simplifying the description, rather than indicating or implying that the indicated device or element must have a specific orientation, or be constructed and operated in a specific orientation, and therefore should not be understood as a limitation of the present disclosure.

In addition, the terms "first" and "second" are used for descriptive purposes only and cannot be understood as indicating or implying relative importance or implicitly specifying the number of technical features indicated. Thus, for a feature defined with "first" and "second," one or more such features may be explicitly or implicitly included. In the description of the present disclosure, "a plurality" means two or more, unless otherwise expressly and specifically defined.

In the present disclosure, a first feature being "above" or "below" a second feature may mean that the first and second features are in direct contact with each other, or the first and second features are in indirect contact through an intermediary, unless otherwise expressly stated and defined. Moreover, a first feature being "on," "above," or "over" a second feature may mean that the first feature is directly above or obliquely above the second feature, or simply mean that the first feature is at a horizontal height higher than the second feature. A first feature being "under," "below," or "beneath" a second feature may mean that the first feature is directly below or obliquely below the second feature, or simply mean that the first feature is at a horizontal height lower than the second feature.

The endpoints and any values of ranges disclosed herein are not limited to the precise ranges or values, which should be understood to include values approximate to these ranges or values. For numeric ranges, the endpoint values of each range, the endpoint values and individual point values of each range, and individual point values may be respectively combined with each other to obtain one or more new numerical ranges, which should be considered as being specifically disclosed herein. Herein, both the terms "optional" and "optionally" mean that the subsequently described feature may or may not be included (or may or may not be present).

The present disclosure is described based on an X-axis direction (i.e., a horizontal direction), a Y-axis direction (i.e., a direction perpendicular to the X-axis in a horizontal plane), and a Z-axis direction (i.e., a vertical direction) of the back side, and a direction away from a silicon substrate is regarded as an outward direction, and a direction close to the silicon substrate is regarded as an inward direction.

In a first aspect, the present disclosure provides a back-contact cell with isolation grooves specifically disposed, including: a silicon substrate having, on a back side, a polished region and a textured region disposed alternately along an X-axis direction of the back side, a first semiconductor layer disposed on the polished region, and a second semiconductor layer disposed on the textured region, wherein the back-contact cell further includes a conductive film layer and a conductive mask layer sequentially disposed outwardly along a Z-axis direction of the back side, a conductive composite layer formed by the conductive mask layer and the conductive film layer is provided with isolation grooves disposed at intervals along the X-axis direction, the isolation groove is located above a contact interface between the first semiconductor layer and the second semiconductor layer in the Z-axis direction, and the isolation groove spans part of the polished region and part of the textured region in the X-axis direction, wherein a ratio of a span length Wa1 of the isolation groove over the polished region to a span length Wa2 of the isolation groove over the textured region is 1:(0.1 to 4) and may for example be 1:0.1, 1:0.2, 1:0.3, 1:0.4, 1:0.5, 1:0.6, 1:0.7, 1:0.8, 1:0.9, 1:1, 1:1.5, 1:2, 1:2.5, 1:3, 1:4, or the like.

The present disclosure includes the following beneficial effects: the isolation grooves are specifically disposed above a contact interface between the first semiconductor layer and the second semiconductor layer in the Z-axis direction to span part of the polished region and part of the textured region at a suitable length ratio, and a conductive composite layer of the conductive film layer and the conductive mask layer is cooperatively disposed over the second semiconductor layer, so that the electric leakage and micro-short-circuiting phenomenon can be greatly ameliorated, while the conductivity is enhanced, thereby enhancing the conversion efficiency of the cell and improving the cell yield. Moreover, the conductive composite layer can serve as a finger electrode, so that silver paste fingers are no longer needed, and the use amount of silver paste is greatly reduced, thereby greatly reducing the cost of metal electrodes.

Here, specifically, the isolation grooves of the present disclosure are specifically disposed as described above, so that the carrier transmission distance between the conductive film layer on the upper surface of the second semiconductor layer and the first semiconductor layer can be appropriately increased, and the insulation resistance between the first semiconductor layer and the second semiconductor layer can be greatly increased, thereby greatly ameliorating the electric leakage and micro-short-circuiting phenomenon and increasing the parallel resistance of the cell. In the present disclosure, a conductive composite layer of the conductive film layer and the conductive mask layer is further cooperatively disposed over the second semiconductor layer (wherein the conductive mask layer may be formed by corrosion after masking with a cheap conductive paste, and can serve to conduct electricity in the Z-axis direction and function as mask etching). The conductive composite layer has a very low sheet resistance, meeting the requirements of transmission of a large number of carriers, and it can be used as a finger electrode, thus the electric leakage and micro-short-circuiting phenomenon can be greatly ameliorated while the conductivity can be enhanced, thereby enhancing the conversion efficiency of the cell. Moreover, the conductive composite layer can serve as a finger electrode, so that silver paste fingers are no longer needed, and the use amount of silver paste is greatly reduced, thereby greatly reducing the cost of metal electrodes. In the present disclosure, a second opening region is formed in the textured region for laying part of the second semiconductor, a first opening region is provided in the middle of the second semiconductor layer, and the first opening region is filled with the conductive film layer. The present disclosure adopts the above-mentioned suitable ratio of the span length of the isolation groove over the polished region to the span length of the isolation groove over the textured region, so that the spacing between the conductive film layer on the surface of the second semiconductor layer and the first semiconductor layer can be significantly increased, while a suitable contact area between the conductive film layer and the second doped silicon crystal layer in the second opening region where the second semiconductor layer is located is also taken into consideration, which is conducive to greatly ameliorating the electric leakage and micro-short-circuiting phenomenon, and the parallel resistance of the cell is increased, meanwhile the requirements of carrier transmission can be met, advantageously reducing a loss during carrier transmission, and improving the conversion efficiency of the back-contact cell. However, under the same conditions, if the ratio of the span lengths described above is unsuitable, for example, if it is too large, a reduced contact area between the conductive film layer and the second doped silicon crystal layer in the second opening region will lead to an increase in contact resistance, thereby reducing the conversion efficiency of the back-contact cell; and if it is too small, the risk of micro-short-circuiting and electric leakage will significantly increase due to an extremely small spacing between the conductive film layer in the second opening region and the first semiconductor layer, thereby affecting the cell yield.

It is understood in the present disclosure that, in the X-axis direction, the isolation groove extends across the edge of the first semiconductor layer, spans part of the polished region and part of the textured region, and is located between a first emitter formed by the first semiconductor layer and a second emitter formed by the second semiconductor layer. The isolation groove in the present disclosure extends along the Y-axis direction, and extends inward along the Z-axis direction to the surface of the second semiconductor layer.

In some embodiments of the present disclosure, the isolation groove has a length Wa of 50 to 300 μm in the X-axis direction. In this embodiment, in consideration of the ratio of the span lengths, the width of span length Wa2 of the isolation groove over the textured region is at a micron level, so that the carrier transmission distance between the conductive film layer on the upper surface of the second semiconductor layer and the first semiconductor layer is increased from tens of nanometers in the case of conventional isolation grooves to several microns or tens of microns according to the present disclosure, and the insulation resistance between the first semiconductor layer and the second semiconductor layer is further greatly increased, which is more conducive to greatly ameliorating the electric leakage and micro-short-circuiting phenomenon while ensuring an enhanced conversion efficiency of the cell.

In the present disclosure, the ranges of Wa1 and Wa2 may be adjusted under the condition that the ratio of Wa1/Wa2 described above (or the ratio and the range of Wa) is satisfied. For example, Wa2 ranges from 1 to 100 μm and may specifically be 1 μm, 9 μm, 10 μm, 20 μm, 23 μm, 30 μm, 33 μm, 40 μm, 50 μm, 60 μm, 70 μm, 80 μm, 90 μm, or 100 μm. Wa1 ranges from 1 to 200 μm and may specifically be 1 μm, 10 μm, 20 μm, 30 μm, 40 μm, 50 μm, 60 μm, 70 μm, 80 μm, 90 μm, 100 μm, 150 μm, or 200 μm, and optionally 20 to 200 μm.

In some embodiments of the present disclosure, the conductive composite layer has a sheet resistance not greater than 50Ω/□. In this embodiment, the conversion efficiency of the cell can be more advantageously enhanced while ensuring a great reduction in the electric leakage and micro-short-circuiting phenomenon.

Optionally, in the present disclosure, the ratio of the thickness of the conductive film layer to the thickness of the conductive mask layer is 1:(10 to 100). In this embodiment, the conductive mask layer can serve to assist in electric conduction and is more advantageous in mask etching.

The conductive film layer in the present disclosure may be a transparent conductive film layer, and optionally may be a composite film layer composed of a transparent conductive film and a metal conductive film. The composite film layer is more advantageous in enhancing the conversion efficiency of the cell.

Optionally, the transparent conductive film may for example be made of a zinc-doped, tin-doped, tungsten-doped, titanium-doped, or silicon-doped indium oxide, or may be made of an aluminum-doped, boron-doped, or gallium-doped zinc oxide. Optionally, the metal conductive film layer may include at least one of metallic aluminum, metallic copper, metallic silver, a nickel alloy (e.g., a nickel-copper alloy), and a titanium alloy. It is understood that the conductive film layer may have multiple layers or one layer, and the material in the same layer may be one material, or may be formed by a combination of multiple materials. Those skilled in the art can make a choice within the above range according to actual needs.

In some embodiments of the present disclosure, the conductive film layer includes at least one of a tin-doped indium oxide, metallic copper, metallic aluminum, metallic silver, and a nickel-copper alloy.

In some embodiments, the conductive film layer has a sheet resistance not greater than 0.7Ω/□, optionally less than 0.2Ω/□. According to the embodiments of the present disclosure, the requirements of carrier transmission can be met, which is more conducive to reducing loss during carrier transmission, and improving conversion efficiency of the cell.

In some embodiments of the present disclosure, the conductive film layer includes a composite film layer formed by a tin-doped indium oxide layer, a metallic copper layer, and a nickel-copper alloy layer sequentially disposed outwardly along the Z-axis direction. In this embodiment, the metallic copper has the characteristics of low resistivity, high infrared reflection, and low material cost, and the nickel-copper alloy has the effect of resisting oxidation and corrosion, thus a conductive film layer with a low sheet resistance and high infrared reflection can be obtained, which is more advantageous in improving the conversion efficiency of the cell.

Optionally, the tin-doped indium oxide layer has a thickness of 50 to 100 nm, the metallic copper layer has a thickness of 200 to 400 nm, and the nickel-copper alloy layer has a thickness of 50 to 100 nm. In this embodiment, each layer has a suitable thickness, which is more conducive to obtaining a conductive film layer with a low sheet resistance and high infrared reflection, and is more advantageous in improving the conversion efficiency of the cell.

In some other embodiments of the present disclosure, the conductive film layer includes a composite film layer of a tin-doped indium oxide layer and a metallic aluminum layer sequentially disposed outwardly along the Z-axis direction. In the embodiments, a conductive film layer with a low sheet resistance and low cost can be obtained, which is more conducive to reducing the cost of the conductive film layer.

Optionally, the tin-doped indium oxide layer has a thickness of 50 to 100 nm, and the metallic aluminum layer has a thickness of 300 to 600 nm.

In the present disclosure, the "conductive mask layer" refers to a mask layer having conductivity. In some embodiments of the present disclosure, the conductive mask layer includes a layer made of at least one of carbon paste, copper paste, nickel paste, and conductive ink, optionally a layer made of carbon paste.

In some embodiments of the present disclosure, the conductive mask layer has a sheet resistance not greater than 50Ω/□. In this embodiment, an effect of assisting in electric conduction can be better achieved, which is more conducive to improving conversion efficiency of the cell.

In some embodiments of the present disclosure, in the Z-axis direction of the polished region, a second semiconductor layer is further disposed over the edges of both sides of the first semiconductor layer in the X-axis direction, and the first semiconductor layer and the second semiconductor layer are distributed one upon another and in direct contact. In the present disclosure, the electric leakage and micro-short-circuiting phenomenon can be greatly ameliorated while ensuring a high conversion efficiency of the cell and cell yield, without disposing an additional insulation dielectric film between the first semiconductor layer and the second semiconductor layer.

It is understood that on the back side of the silicon substrate along the X-axis direction, the first semiconductor layer and the second semiconductor layer are arranged alternatingly, and there is an interval between the first opening region and the second opening region, in which the first semiconductor layer and the second semiconductor layer are stacked one upon another.

The first semiconductor layer and the second semiconductor layer in the present disclosure may be a conventional heterojunction passivated structure, In other words, both are passivated by using an intrinsic amorphous silicon layer (e.g., a doped intrinsic amorphous silicon layer); or they may also be a combined passivated structure, in other words, the first semiconductor layer includes a tunnel oxide layer and a first doped silicon crystal layer, and the second semiconductor layer includes an intrinsic amorphous silicon layer and a second doped silicon crystal layer.

In some embodiments of the present disclosure, the first semiconductor layer includes a tunnel oxide layer and a first doped silicon crystal layer, and the second semiconductor layer includes an intrinsic amorphous silicon layer and a second doped silicon crystal layer, wherein one of the first doped silicon crystal layer and the second doped silicon crystal layer is of N-type, the other of the first doped silicon crystal layer and the second doped silicon crystal layer is of P-type, and the first doped silicon crystal layer is a doped polysilicon layer, and the second doped silicon crystal layer is a doped amorphous silicon or microcrystalline silicon layer. In this embodiment, the back-contact cell in the present disclosure has a combined passivated structure. The specific widened configuration of the isolation grooves in the present disclosure is more advantageous in reducing micro-short-circuiting problems existing in cells having a combined passivated structure, further increasing the parallel resistance.

In some embodiments, the ratio of the span length Wa1 of the isolation groove over the polished region to the span length Wa2 of the isolation groove over the textured region is 1:(0.1 to 1), optionally 1:(0.5 to 1). In this embodiment, it is more conducive to reducing the electric leakage and micro-short-circuiting problems existing in cells having a combined passivated structure, and the parallel resistance is further increased, and meanwhile the conversion efficiency of the cell is further enhanced.

Optionally, a second opening region is formed in the textured region for laying part of the second semiconductor layer, and in the Z-axis direction of the polished region, the second semiconductor layer provided with a first opening region in middle is further disposed over the first semiconductor layer, wherein the first opening region is filled with the conductive film layer. It is understood that the first opening region is configured for exposing the first semiconductor layer below to facilitate the formation of a first emitter.

Optionally, in the X-axis direction, the span length of the isolation groove over the polished region and the span length of the isolation groove over the textured region are recorded as Wa1 and Wa2, respectively, which satisfy: Wa1/Wg is 5% to 100%, and Wa2/W2 is 1% to 25%, where Wg is an interval between the first opening region and the second opening region, and W2 is the length of the second opening region. In this embodiment, the spacing between the conductive film layer on the surface of the second semiconductor layer and the first semiconductor layer can be increased, while a suitable contact area between the conductive film layer and the second doped silicon crystal layer in the second opening region is also taken into consideration, which is more advantageous in increasing the parallel resistance of cells having a combined passivated structure and the conversion efficiency of the cells having a combined passivated structure.

Wa1/Wg is 5% to 100% and may for example be 5%, 10%, 20%, 25%, 30%, 40%, 50%, 60%, 67%, 70%, 77%, 80%, 90%, 91%, 100%, or the like.

Wa2/W2 is 1% to 25% and may for example be 1%, 2%, 5%, 6%, 8%, 10%, 13%, 15%, 19%, 20%, 23%, 25%, or the like.

In some embodiments, Wa2/W2 is 8% to 25%. In this embodiment, it is more conducive to reducing the electric leakage and micro-short-circuiting problem, and the parallel resistance and the cell yield can be further increased, meanwhile the conversion efficiency of the cell can be further enhanced.

Optionally, the tunnel oxide layer is made of silica with a thickness of 0.5 to 3 nm; the first doped silicon crystal layer is a phosphorus-doped or boron-doped polysilicon layer with a thickness of 50 to 300 nm and a resistivity of 1E-4 $\Omega$·cm to 1E-2 $\Omega$·cm; the intrinsic amorphous silicon layer has a thickness of 5 to 15 nm; and the second doped silicon crystal layer is a phosphorus-doped or boron-doped amorphous silicon layer, or a phosphorus-doped or boron-doped microcrystalline silicon layer, with a thickness of 5 to 30 nm and a resistivity of 1E-1 $\Omega$·cm to 1E9 $\Omega$·cm.

In the combined passivated structure, the first semiconductor layer has good conductivity, and the second doped silicon crystal layer and the second semiconductor layer thereof have poor conductivity, thus the span length Wa2 of the isolation groove in the present disclosure is expected to be as small as possible under the condition of satisfying the insulation effect, and the width Wa1 has little impact.

The second doped silicon crystal layer has a resistivity of about 1E-1 to 1E2 $\Omega$·cm when it is an N-type amorphous/microcrystalline silicon layer, and the second doped silicon crystal layer has a resistivity of about 1E4 to 1E9 $\Omega$·cm when it is a P-type amorphous/microcrystalline silicon layer.

Optionally, the first opening region has a length W1 of 100 to 300 μm in the X-axis direction.

Optionally, the second opening region has a length W2 of 300 to 700 μm in the X-axis direction.

Optionally, there is an interval Wg of 50 to 400 μm between the first opening region and the second opening region in the X-axis direction.

In some embodiments of the present disclosure, the back-contact cell further includes: an insulation layer, which is disposed on a surface of the conductive mask layer along the Z-axis direction, and has a first portion disposed in the isolation groove, and a second portion disposed at intervals on the outer surface of the conductive mask layer, wherein a side surface of the second portion is in contact with the first portion; optionally, the second portion of the insulation layer has a thickness of 5 to 50 μm; and busbars, which are disposed to extend along the X-axis direction and electrically connect the conductive mask layers located in the Z-axis direction of the first semiconductor layer and the second semiconductor layer in series, and are disposed at intervals along a Y-axis direction.

In some embodiments of the present disclosure, the back-contact cell further includes: a front-side passivation layer and an antireflective layer, which are sequentially disposed on a front side of the silicon substrate outwardly along the Z-axis direction, wherein the front side of the silicon substrate is the textured region.

Those skilled in the art can choose the materials of the front-side passivation layer and the antireflective layer according to needs. Exemplarily, the front-side passivation layer is made of a silicon dielectric material and specifically may, for example, be made of at least one of amorphous silicon, microcrystalline silicon, silicon oxide, and polysilicon; and the antireflective layer is a silicon dielectric layer and specifically may, for example, be made of at least one of silicon nitride, silicon oxide, and silicon oxynitride. This is not limited in the present disclosure.

In a second aspect, the present disclosure provides a preparation method for the back-contact cell described in the first aspect, including the following steps:

S100, providing a cell panel including a silicon substrate having, on the back side, the first semiconductor layer and the second semiconductor layer, wherein a part of the back side where the first semiconductor layer is located is the polished region, and a part of the back side where the second semiconductor layer is located is the textured region;

S101, forming the conductive film layer fully covering the back side of the cell panel obtained in S100;

S102, forming the conductive mask layer on the back side of the cell panel obtained in S101, with isolation openings disposed at intervals along the X-axis direction being left in the conductive mask layer, wherein the isolation opening is located above a contact interface between the first semiconductor layer and the second semiconductor layer in the Z-axis direction, and spans the polished region and the textured region in the X-axis direction; and S103, etching the back side of the cell panel obtained in S102 to remove part of the conductive film layer located below the isolation openings, so as to form the isolation grooves located in the conductive composite layer formed by the conductive mask layer and the conductive film layer.

In the preparation method of the present disclosure, a conductive mask layer having isolation openings is first formed, then etching is performed to form isolation grooves, and a finger electrode is obtained at the same time. Here, the conductive mask layer can function as protecting in the etching process for forming isolation grooves, and there is no need to perform a subsequent step of removing the protective layer (conductive mask layer). Thus, the process preparation procedures are simplified while the electric leakage and micro-short-circuiting is greatly ameliorated and the conversion efficiency of the cell is improved. In contrast, in the preparation of isolation grooves in the prior art, an isolation groove pattern is usually formed by using printing protective ink and then is corroded by a chemical solution, and subsequently it is necessary to clean off the printing protective ink, thus the process is relatively cumbersome.

In addition, the inventors of the present disclosure have found in research that a first doped silicon crystal layer in the combined passivated cell structure is a doped polysilicon layer with a very low resistivity and is paired with a tunnel oxide layer in which leakage current is likely to occur, and a second doped silicon crystal layer in the combined passivated cell structure is a doped amorphous silicon or microcrystalline silicon layer, so that the whole combined passivated structure is more likely to have an electric leakage and micro-short-circuiting problem. However, a first doped silicon crystal layer and a second doped silicon crystal layer in a conventional heterojunction cell structure are both amorphous silicon or microcrystalline silicon layers with a very high resistivity and are both passivated by using intrinsic amorphous silicon, thus the whole heterojunction passivated structure thereof is not likely to have an electric leakage and micro-short-circuiting problem. Therefore, the micro-short-circuiting and electric leakage phenomenon is more likely to occur in the combined passivated cell structure, as compared with the conventional heterojunction cell structure. The specific widened configuration of the isolation grooves in the present disclosure is more advantageous in reducing the electric leakage and micro-short-circuiting problem that is more likely to occur in a combined passivated back-contact cell structure, and allows for a further increase in the parallel resistance as well as an enhanced conversion efficiency of the cell.

In the cell panel in S100 in the present disclosure, optionally in the Z-axis direction of the polished region, the first semiconductor layer and the second semiconductor layer distributed one upon another are in direct contact with each other. The preparation method for the cell panel is not limited in the present disclosure, as long as the desired structure can be formed. For example, a post-texturing method described in CN115312633A which is researched earlier by the applicant of the present disclosure may be used.

In some embodiments of the present disclosure, the conductive film layer is formed by means of deposition in S101.

In some embodiments of the present disclosure, the conductive mask layer is formed by means of printing or inkjet in S102.

In some embodiments of the present disclosure, the etching in S103 is performed by using a chemical corrosive solution. The chemical corrosive solution in the present disclosure has good selectivity in corroding the conductive film layer and the second semiconductor layer, and can quickly corrode the conductive film layer, but does not corrode and damage the second semiconductor layer. Optionally, the chemical corrosive solution is at least one of a sulfuric acid solution (which may for example be at a concentration 1 to 10 wt %), a hydrochloric acid solution (which may for example be at a concentration of 5 to 30 wt %), a hydrogen peroxide solution (which may for example be at a concentration of 2 to 20 wt %), and a ferric chloride solution (which may for example be at a concentration of 5 to 30 wt %).

In some embodiments of the present disclosure, S100 further includes: disposing a front-side passivation layer and an antireflective layer on a front-side textured region of the cell panel.

In some embodiments of the present disclosure, the preparation method further includes:

S104, filling the isolation grooves in the back side of the cell panel obtained in S103 with an insulation layer material, while disposing the insulation layer material arranged at intervals on a surface of the conductive mask layer on the back side of the cell panel, so as to form an insulation layer; and S105, printing several busbars on the back side of the cell panel obtained in S104, wherein the busbars connect the conductive mask layers on the first semiconductor layer and the second semiconductor layer in series to form a busbar electrode.

In S104, those skilled in the art can choose a method for forming an insulation layer according to actual needs. For example, the insulation layer may be formed by means of printing or spraying.

In S105, while the busbars are being printed, those skilled in the art can choose whether to print busbar pad points according to actual needs. A printing material for the busbars may be existing silver paste, tin paste, or the like, which can be chosen by those skilled in the art according to actual needs.

The present disclosure is described in further detail below with reference to specific examples.

In an example of the present disclosure, a back-contact cell with isolation grooves specifically disposed is provided, and the preparation method and structure thereof are described as follows.

In S100, as shown in FIG. 1, a back-contact cell panel is provided, in which a silicon substrate 1 has a front-side passivation layer 6 (consisting of an intrinsic doped amorphous silicon layer and N-type microcrystalline silicon) and an antireflective layer 7 formed on its front side and has a first semiconductor layer and a second semiconductor layer formed on its back side. Here, the first semiconductor layer and the second semiconductor layer are brought into direct contact with each other at a region where they were superimposed one upon another. The first semiconductor layer is composed of a tunnel oxide layer 2 with a thickness of 1.5 nm and an N-type doped polysilicon layer 3 with a thickness of 100 nm (having a resistivity of 1E-3 Ω·cm). The second semiconductor layer is composed of an intrinsic doped amorphous silicon layer 4 with a thickness of 10 nm and a P-type doped amorphous silicon layer 5 with a thickness of 20 nm (having a resistivity of 1E2 Ω·cm). A second opening region is formed in the textured region for laying part of the second semiconductor layer. A second semiconductor layer provided with a first opening region in middle is further disposed over the first semiconductor layer in the Z-axis direction of the polished region. The first opening region is filled with the conductive film layer. In the X-axis direction, the first opening region has a length W1 of 200 μm, the second opening region has a length W2 of 400 μm, and there is an interval Wg of 100 μm between the first opening region and the second opening region.

Figure 2:
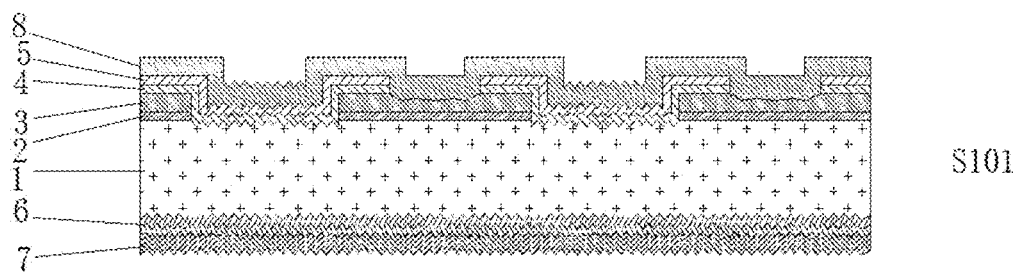
FIG. 2 is a schematic structural diagram in which a conductive film layer is deposited on the back side of the cell of FIG. 1 according to the present disclosure.

In S101, as shown in FIG. 2, a conductive film layer 8 is deposited on the back side of the cell panel obtained in S100. The conductive film layer 8 is a composite film layer formed by a tin-doped indium oxide layer, a metallic copper layer, and a nickel-copper alloy layer sequentially disposed outwardly along the Z-axis direction, wherein the tin-doped indium oxide layer (80 nm)+the metallic copper layer (300 nm)+the nickel-copper alloy layer (80 nm) has a sheet resistance of 0.08Ω/□.

Figure 3:
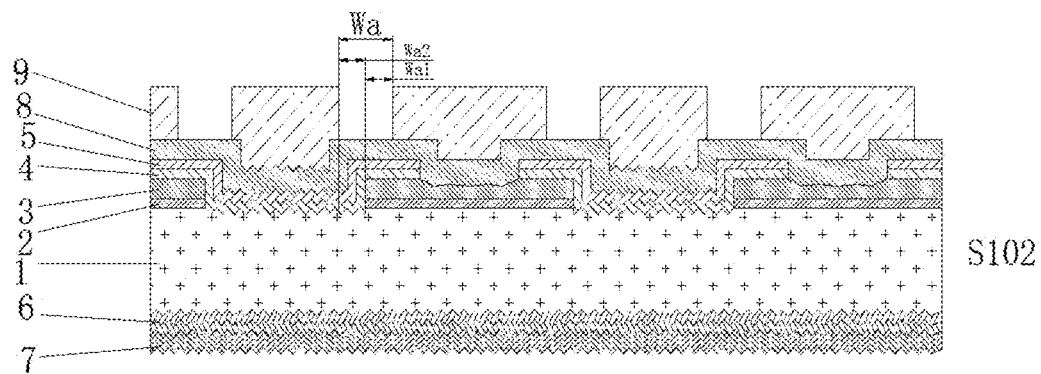
FIG. 3 is a schematic structural diagram in which one conductive mask layer is formed on the back side of the cell of FIG. 2 according to the present disclosure.

In S102, as shown in FIG. 3, one conductive mask layer 9 is formed on the back side of the cell panel obtained in S101. The conductive mask layer 9 has a thickness of 10 μm and a sheet resistance of 20Ω/□. Isolation openings with a gap width of Wa are formed in the conductive mask layer 9 at the edge of the first semiconductor layer, wherein the length of Wa is 100 μm, and the ratio of the span length Wa1 of Wa over the polished region to the span length Wa2 of Wa over the textured region in the X-axis direction is 1:0.5, where Wa1/Wg is 67%, and Wa2/W2 is 8%. The conductive mask layer 9 is made of carbon paste and formed by means of printing.

Figure 3A:
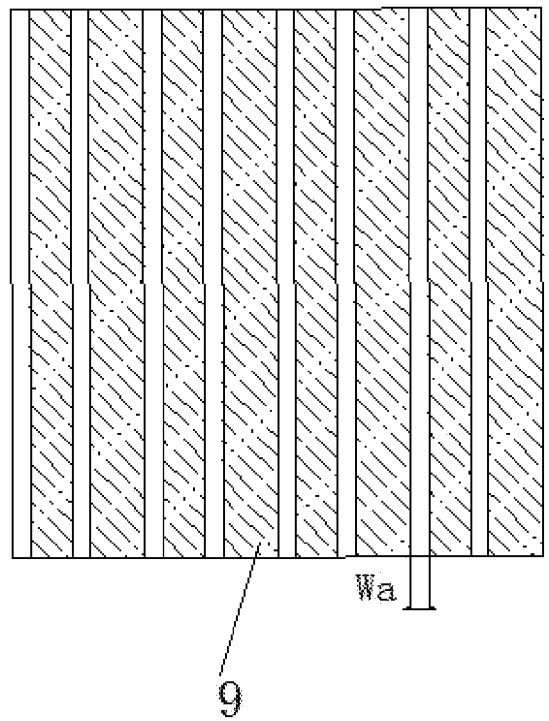
FIG. 3a is a schematic plan diagram of a screen of the conductive mask layer according to the present disclosure.
Figure 3B:
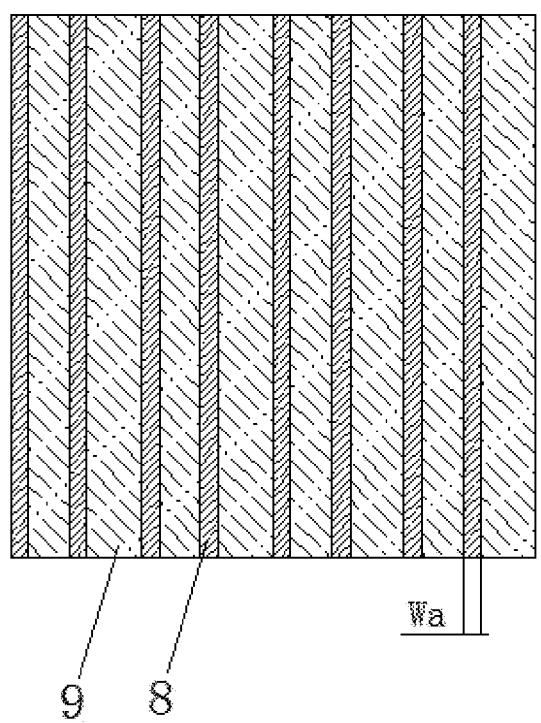
FIG. 3b is a top view of part of the back side of the cell after the conductive mask layer is formed on the back side of the cell by FIG. 3a according to the present disclosure.

FIG. 3a is a schematic diagram showing a pattern of a screen for the conductive mask layer 9 in this example. FIG. 3b is a schematic diagram of the back side of the cell in this example after the conductive mask layer 9 was formed thereon.

Figure 4:
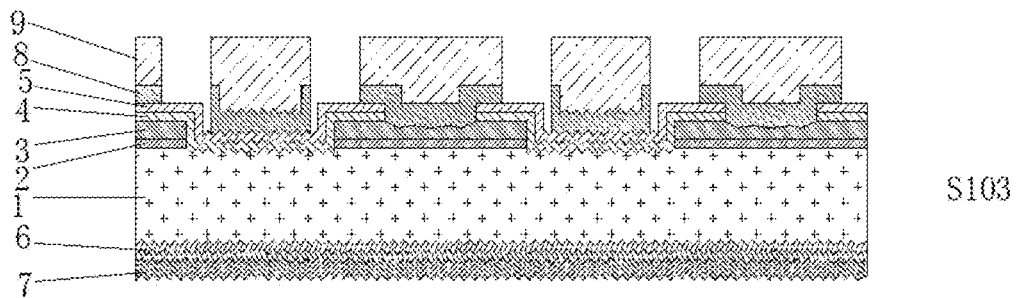
FIG. 4 is a schematic structural diagram of FIG. 3 in which the conductive film layer between the conductive mask layers is corroded away by a chemical corrosive solution according to the present disclosure.

In S103, as shown in FIG. 4, the cell having the conductive mask layer formed thereon is subjected to a chemical corrosive solution, with which the conductive film layer in the gaps Wa between the conductive mask layers is corroded away and isolation grooves with a width of Wa are formed. The corrosive solution is a mixed solution of 20 wt % hydrochloric acid and 10 wt % hydrogen peroxide.

Figure 5:
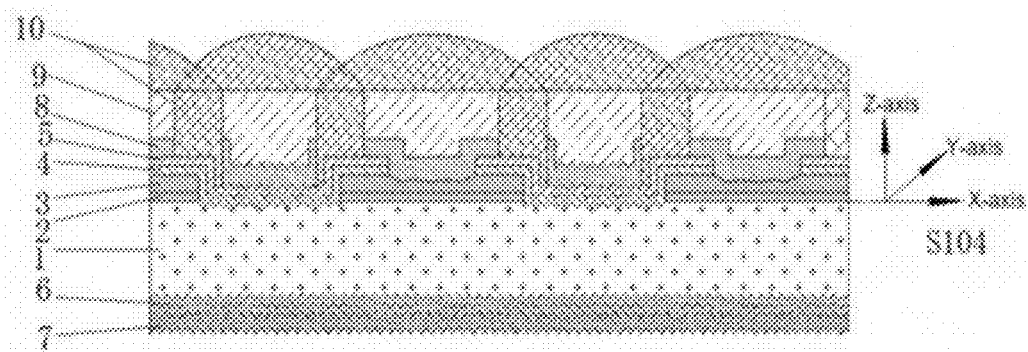
FIG. 5 is a schematic structural diagram in which insulation ink is formed on the back side of the cell of FIG. 4 according to the present disclosure.

In S104, as shown in FIG. 5, insulation ink is printed in the isolation grooves Wa on the back side of the cell panel obtained in S103, and at the same time an insulation ink layer with a thickness of 20 μm arranged at intervals is formed on the conductive mask layer 9 to form an insulation layer 10. The insulation ink is formed by means of printing.

Figure 5A:
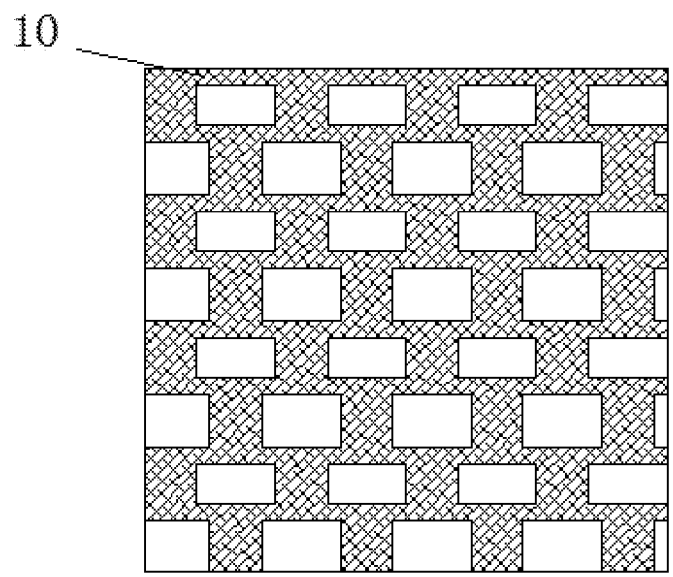
FIG. 5a is a schematic plan diagram of a screen of insulation ink according to the present disclosure.
Figure 5B:
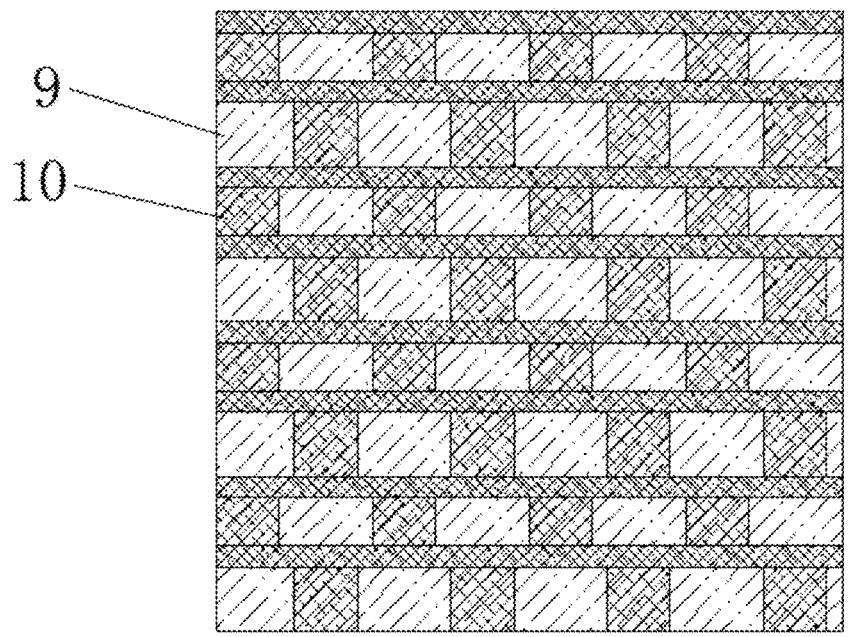
FIG. 5b is a top view of part of the back side of the cell after an insulation ink layer is formed on the back side of the cell by FIG. 5a according to the present disclosure.

FIG. 5a is a schematic diagram showing a pattern of a screen for the insulation ink layer in this example. FIG. 5b is a schematic diagram of the back side of the cell in this example after the insulation ink layer was formed thereon.

Figure 6:
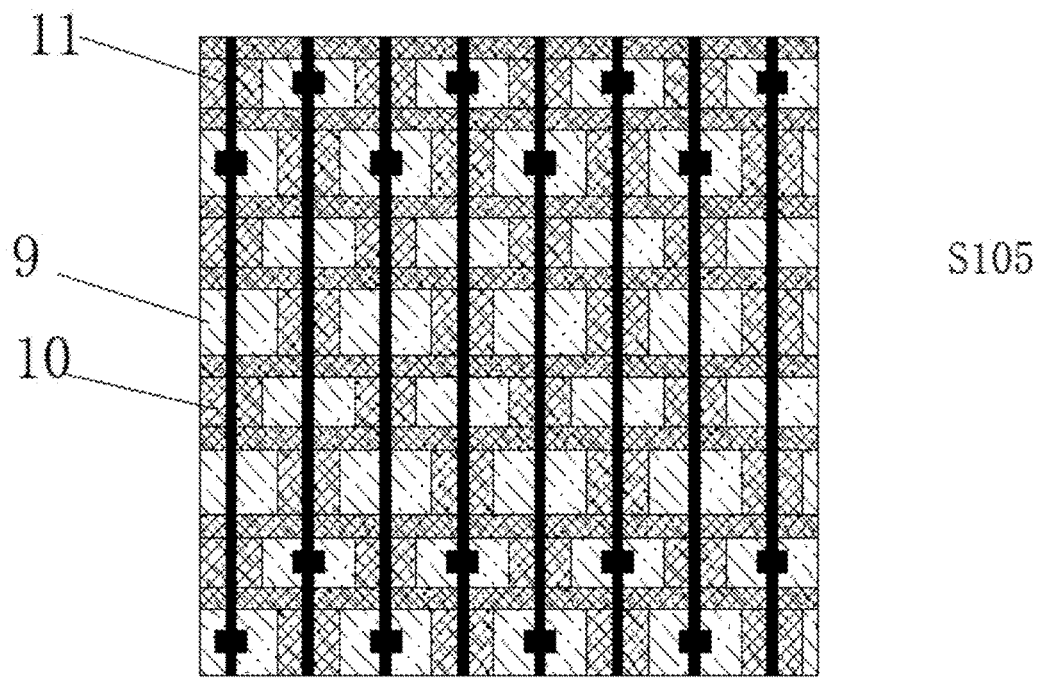
FIG. 6 is a schematic plan diagram after a busbar electrode is formed on the back side of the cell of FIG. 5 according to the present disclosure.

In S105, as shown in FIG. 6, busbars of silver paste are printed on the back side of the cell panel obtained in S104, such that the conductive mask layers on the first semiconductor layer and the second semiconductor layer are connected in series to form a busbar electrode 11.

The consumption of the silver paste, the parallel resistance, and the conversion efficiency of the cell in this example are shown in Table 1 below, respectively.

An optional example was performed by reference to the method of the foregoing example, except that the sheet resistance of the conductive film layer was $0.3\Omega/\square$.

The consumption of the silver paste, the parallel resistance, and the conversion efficiency of the cell in this example are shown in Table 1 below, respectively.

An optional example was performed by reference to the method of the foregoing example, except that in S105, tin paste was printed as busbars, instead of silver paste.

The consumption of silver paste, the parallel resistance, and the conversion efficiency of the cell in this example are shown in Table 1 below.

An optional example was performed by reference to the method of the foregoing example, except that the conductive film layer was a composite film layer of a tin-doped indium oxide layer and a metallic aluminum layer, wherein the ratio of the thickness of the tin doped indium oxide layer to that of the metallic aluminum layer was 1:5, the total thickness of the composite film layer was the same as that in the foregoing example, and the sheet resistance of the composite film layer was $0.2\Omega/\square$.

The consumption of the silver paste, the parallel resistance, and the conversion efficiency of the cell in this example are shown in Table 1 below, respectively.

An optional example was performed by reference to the method of the foregoing example, except that Wa was adjusted to 300 μm, Wa1/Wa2 was unchanged, Wa2/W2 was 25% in this case, and Wg was adjusted such that Wa1/Wg was 80%.

The consumption of the silver paste, the parallel resistance, and the conversion efficiency of the cell in this example are shown in Table 1 below, respectively.

An optional example was performed by reference to the method of the foregoing example, except that the ratio of the span length of the isolation groove over the polished region to the span length of the isolation groove over the textured region was different therefrom, wherein Wa2 was changed such that Wa1/Wa2=1:0.3, and in this case Wa1/Wg was 77% and Wa2/W2 was 6%.

The consumption of the silver paste, the parallel resistance, and the conversion efficiency of the cell in this example are shown in Table 1 below, respectively.

An optional example was performed by reference to the method of the foregoing example, except that the ratio of the span length of the isolation groove over the polished region to the span length of the isolation groove over the textured region was different therefrom, wherein Wa2 was changed such that Wa1/Wa2=1:0.1, and in this case Wa1/Wg was 91% and Wa2/W2 was 2%.

The consumption of the silver paste, the parallel resistance, and the conversion efficiency of the cell in this example are shown in Table 1 below, respectively.

An optional example was performed by reference to the method of the foregoing example, except that Wa1 was changed such that Wa1/Wg was 10%, and Wa2 was adjusted such that Wa1/Wa2 was 1:4 and Wa2/W2 was 10%.

The consumption of the silver paste, the parallel resistance, and the conversion efficiency of the cell in this example are shown in Table 1 below, respectively.

An optional example was performed by reference to the method of the foregoing example, except that Wa2 was changed such that Wa2/W2 was 20%, Wa was unchanged, and in this case Wa1/Wa2 was 1:4 and Wa1/Wg was 20%.

The consumption of the silver paste, the parallel resistance, and the conversion efficiency of the cell in this example are shown in Table 1 below, respectively.

An optional example was performed by reference to the method of the foregoing example, except that the ratio of the span length of the isolation groove over the polished region to the span length of the isolation groove over the textured region was different therefrom, wherein Wa2 was changed such that Wa1/Wa2=1:3, Wa was unchanged, and in this case Wa1/Wg was 25% and Wa2/W2 was 19%.

The consumption of the silver paste, the parallel resistance, and the conversion efficiency of the cell in this example are shown in Table 1 below, respectively.

An optional example was performed by reference to the method of the foregoing example, except that the passivation structure was different therefrom, and conventional heterojunction passivation was employed. Specifically, the tunnel oxide layer with a thickness of 2 nm in the first semiconductor layer was replaced with an intrinsic doped amorphous silicon layer with a thickness of 10 nm for passivation.

The consumption of the silver paste, the parallel resistance, and the conversion efficiency of the cell in this example are shown in Table 1 below, respectively.

An optional comparative example was performed by reference to the method of the foregoing example, except that the conductive composite layer of the conductive film layer and the conductive mask layer was not disposed, but only a transparent conductive film layer was deposited over the second semiconductor layer in a manner of full cover, then protective ink was printed in a region where the first semiconductor layer and the second semiconductor layer were distributed one upon another, and isolation grooves (the size is the same as the first example) were formed by corrosion and cleaning, then the protective ink was cleaned off, and then silver paste was printed to form conventional fingers. The other steps (formation of an insulation layer and busbars) were exactly the same as those in the foregoing example.

The consumption of the silver paste, the parallel resistance, and the conversion efficiency of the cell in this comparative example are shown in Table 1 below, respectively.

An optional comparative example was performed by reference to the method of the foregoing example, except that the isolation groove was not disposed above a contact interface between the first semiconductor layer and the second semiconductor layer in the Z-axis direction, but disposed in an interval (Wg) region between the first opening region and the second opening region. In other words, the isolation groove did not span to the textured region in the X-axis direction.

The consumption of the silver paste, the parallel resistance, and the conversion efficiency of the cell in this comparative example are shown in Table 1 below, respectively.

An optional comparative example was performed by reference to the method of the foregoing example, except that the ratio of the span length of the isolation groove over the polished region to the span length of the isolation groove over the textured region was different therefrom, wherein Wa2 was changed such that Wa1/Wa2=1:0.02.

The consumption of the silver paste, the parallel resistance, and the conversion efficiency of the cell in this comparative example are shown in Table 1 below, respectively.

TABLE 1

| Examples | Silver Paste Consumption (mg/wafer) | Yield (%) | Parallel Resistance (Ω) | Conversion Efficiency of Cell (%) |
|---|---|---|---|---|
| Example | 60 | 98 | 5000 | 26.3 |
| Example | 60 | 98 | 5000 | 26.1 |
| Example | 0 | 98 | 5000 | 26.2 |
| Example | 60 | 98 | 5000 | 26.0 |
| Example | 60 | 98 | 8000 | 26.0 |
| Example | 60 | 97.8 | 3000 | 26.25 |
| Example | 60 | 97 | 1000 | 26.25 |
| Example | 60 | 97.5 | 8000 | 26.25 |
| Example | 60 | 98 | 8000 | 26.0 |
| Example | 60 | 98 | 8000 | 26.0 |
| Example | 60 | 96.5 | 8000 | 25.9 |
| Comparative Example | 200 | 98 | 5000 | 26.3 |
| Comparative Example | 60 | 98 | 30 | 25.9 |
| Comparative Example | 60 | 96 | 500 | 26.2 |

Note:
in the "mg/wafer", each wafer was sized as an M10 silicon wafer.

It can be seen from the above examples and comparative examples that by using the back-contact cell structure with isolation grooves positioned specifically and having a suitable span length ratio according to the present disclosure, the electric leakage and micro-short-circuiting phenomenon is greatly ameliorated, while the conversion efficiency of the cell is improved and the cell yield is enhanced, and moreover the use amount of silver paste is greatly reduced, whereby the cost of metal electrodes is greatly reduced. In contrast, the comparative examples which fail to satisfy the scope of the present disclosure cannot achieve the comprehensive effects of the present disclosure, including the silver paste consumption, yield, parallel resistance, and conversion efficiency of the cell.

Further, as can be seen from some examples, when an optional conductive film layer in the present disclosure is used, the consumption of silver paste can be reduced while the conversion efficiency of the cell can be further improved. As can be seen from some examples, using optional specific structural sizes in the present disclosure is more conducive to improving the cell yield, while the parallel resistance of the cell and the conversion efficiency of the cell can also be enhanced. As can be seen from some examples, the structure of the isolation grooves positioned specifically and having a suitable span length ratio according to the present disclosure is applicable to cells having a combined passivated structure and heterojunction cells, is more conducive to promoting the performance of the cells having a combined passivated structure, and can achieve a well-balanced comprehensive improvement in silver paste consumption, yield, parallel resistance, and conversion efficiency of the cells having a combined passivated structure.

Description of Reference Numerals: 1. silicon substrate, 2. tunnel oxide layer, 3. N-type doped polysilicon layer, 4. intrinsic doped amorphous silicon layer, 5. P-type doped amorphous silicon layer, 6. front-side passivation layer, 7. antireflective layer, 8. conductive film layer, 9. conductive mask layer, 10. insulation layer, 11. busbar electrode.

The embodiments of the present disclosure are described above in detail, but the present disclosure is not limited thereto. A variety of simple variations of the technical solutions of the present disclosure may be made within the scope of the technical concept of the present disclosure, including combinations of the respective technical features in any other appropriate manner. These simple variations and combinations shall also be considered as being disclosed in the present disclosure and fall within the scope of protection of the present disclosure.

What is claimed is:

1. A back-contact cell with isolation grooves specifically disposed, comprising:
a silicon substrate having, on a back side, a polished region and a textured region disposed alternately along an X-axis direction of the back side;
a first semiconductor layer disposed on the polished region; and
a second semiconductor layer disposed on the textured region, wherein the back-contact cell further comprises a conductive film layer and a conductive mask layer sequentially disposed outwardly along a Z-axis direction of the back side, a conductive composite layer formed by the conductive mask layer and the conductive film layer is provided with isolation grooves disposed at intervals along the X-axis direction, each isolation groove is located above a contact interface between the first semiconductor layer and the second semiconductor layer in the Z-axis direction, and each isolation groove spans part of the polished region and part of the textured region in the X-axis direction, wherein a ratio of a span length Wa1 of each isolation groove over the polished region to a span length Wa2 of each isolation groove over the textured region is 1:(0.1 to 4), wherein the conductive film layer comprises at least one of a tin-doped indium oxide, metallic copper, metallic aluminum, metallic silver, and a nickel-copper alloy, and/or, the conductive film layer has a sheet resistance not greater than 0.7Ω/□,
wherein the conductive film layer comprises a composite film layer formed by a tin-doped indium oxide layer, a metallic copper layer, and a nickel-copper alloy layer sequentially disposed outwardly along the Z-axis direction, wherein the tin-doped indium oxide layer has a thickness of 50 to 100 nm, the metallic copper layer has a thickness of 200 to 400 nm, and the nickel-copper alloy layer has a thickness of 50 to 100 nm; and/or
the conductive film layer comprises a composite film layer of a tin-doped indium oxide layer and a metallic aluminum layer sequentially disposed outwardly along the Z-axis direction, wherein the tin-doped indium oxide layer has a thickness of 50 to 100 nm, and the metallic aluminum layer has a thickness of 300 to 600 nm.

2. The back-contact cell according to claim 1, wherein the ratio of the span length Wa1 of each isolation groove over the polished region to the span length Wa2 of each isolation groove over the textured region is 1:(0.1 to 1); and/or, a length Wa of each isolation groove in the X-axis direction is 50 to 300 μm.

3. The back-contact cell according to claim 1, wherein the conductive composite layer has a sheet resistance not greater than 50Ω/□, and/or, a ratio of a thickness of the conductive film layer to a thickness of the conductive mask layer is 1:(10 to 100).

4. The back-contact cell according to claim 1, wherein the conductive mask layer comprises a layer made of at least one of carbon paste, copper paste, nickel paste, and conductive ink, and/or, the conductive mask layer has a sheet resistance not greater than 50Ω/□.

5. The back-contact cell according to claim 1, wherein in the Z-axis direction of the polished region, the second semiconductor layer is further disposed over the edges of both sides of the first semiconductor layer in the X-axis direction, and the first semiconductor layer and the second semiconductor layer are distributed one upon another and in direct contact.

6. The back-contact cell according to claim 1, wherein the first semiconductor layer comprises a tunnel oxide layer and a first doped silicon crystal layer, and the second semiconductor layer comprises an intrinsic amorphous silicon layer and a second doped silicon crystal layer, wherein one of the first doped silicon crystal layer and the second doped silicon crystal layer is of N-type, the other is of P-type, and the first doped silicon crystal layer is a doped polysilicon layer, and the second doped silicon crystal layer is a doped amorphous silicon or microcrystalline silicon layer; a second opening region is formed in the textured region for laying part of the second semiconductor layer, and in the Z-axis direction of the polished region, the second semiconductor layer, which is provided with a first opening region in the middle, is further disposed over the first semiconductor layer, wherein the first opening region is filled with the conductive film layer.

7. The back-contact cell according to claim 6, wherein in the X-axis direction, the span length of each isolation groove over the polished region and the span length of each isolation groove over the textured region are recorded as Wa1 and Wa2, respectively, which satisfy: Wa1/Wg is 5% to 100%, and Wa2/W2 is 1% to 25%, where Wg is an interval between the first opening region and the second opening region, and W2 is a length of the second opening region; and/or in the X-axis direction, the first opening region has a length W1 of 100 to 300 μm, the second opening region has a length W2 of 300 to 700 μm, and the interval Wg between the first opening region and the second opening region is 50 to 400 μm.

8. The back-contact cell according to claim 6, wherein the tunnel oxide layer is made of silica with a thickness of 0.5 to 3 nm; the first doped silicon crystal layer is a phosphorus-doped or boron-doped polysilicon layer with a thickness of 50 to 300 nm and a resistivity of 1E-4 Ω·cm to 1E-2 Ω·cm; the intrinsic amorphous silicon layer has a thickness of 5 to 15 nm; and the second doped silicon crystal layer is a phosphorus-doped or boron-doped amorphous silicon layer, or a phosphorus-doped or boron-doped microcrystalline silicon layer, with a thickness of 5 to 30 nm and a resistivity of 1E-1 Ω·cm to 1E9 Ω·cm.

9. The back-contact cell according to claim 1, further comprising:
an insulation layer, disposed on a surface of the conductive mask layer along the Z-axis direction, wherein the insulation layer has a first portion disposed in each isolation groove, and a second portion disposed at intervals on an outer surface of the conductive mask layer, wherein a side surface of the second portion is in contact with the first portion; and the second portion of the insulation layer has a thickness of 5 to 50 μm;
busbars, which are disposed to extend along the X-axis direction and electrically connect the conductive mask layer located in the Z-axis direction of the first semiconductor layer and the second semiconductor layer in series, wherein the busbars are disposed at intervals along a Y-axis direction; and
a front-side passivation layer and an antireflective layer, which are sequentially disposed on a front side of the silicon substrate outwardly along the Z-axis direction, wherein the front side of the silicon substrate is a textured region.

10. A preparation method for the back-contact cell according to claim 1, comprising steps of:
S100, providing a cell panel comprising the silicon substrate having, on the back side, the first semiconductor layer and the second semiconductor layer, wherein a part of the back side where the first semiconductor layer is located is the polished region, and a part of the back side where the second semiconductor layer is located is the textured region;
S101, forming the conductive film layer fully covering the back side of the cell panel obtained in S100;
S102, forming the conductive mask layer on the back side of the cell panel obtained in S101, with isolation openings disposed at intervals along the X-axis direction being left in the conductive mask layer, wherein each isolation opening is located above a contact interface between the first semiconductor layer and the second semiconductor layer in the Z-axis direction, and spans the polished region and the textured region in the X-axis direction; and
S103, etching the back side of the cell panel obtained in S102 to remove part of the conductive film layer located below the isolation openings, so as to form the isolation grooves located in the conductive composite layer formed by the conductive mask layer and the conductive film layer, to thereby form a back-contact cell having the structure as specified in claim 1.

11. The preparation method according to claim 10, wherein the conductive film layer is formed by means of deposition in S101, and the conductive mask layer is formed by means of printing or inkjet in S102; and/or, the etching in S103 is performed by using a chemical corrosive solution, and the chemical corrosive solution is at least one of a sulfuric acid solution, a hydrochloric acid solution, a hydrogen peroxide solution, and a ferric chloride solution.

12. The preparation method according to claim 10, wherein S100 further comprises: disposing a front-side passivation layer and an antireflective layer on a front-side textured region of the cell panel; and/or
the preparation method further comprises:
S104, filling the isolation grooves in the back side of the cell panel obtained in S103 with an insulation layer material, while disposing the insulation layer material arranged at intervals on a surface of the conductive mask layer on the back side of the cell panel, so as to form an insulation layer; and
S105, printing several busbars on the back side of the cell panel obtained in S104, wherein the busbars connect the conductive mask layers on the first semiconductor layer and the second semiconductor layer in series to form a busbar electrode.

* * * * *